(12) United States Patent
Roessler et al.

(10) Patent No.: US 6,212,071 B1
(45) Date of Patent: Apr. 3, 2001

(54) ELECTRICAL CIRCUIT BOARD HEAT DISSIPATION SYSTEM

(75) Inventors: Robert Joseph Roessler, Rowlett; William Lonzo Woods, Jr., Kaufman, both of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/378,687

(22) Filed: Aug. 20, 1999

(51) Int. Cl.$^7$ ...................................................... H05K 7/20
(52) U.S. Cl. ..................... 361/704; 361/714; 361/720; 361/792; 174/252; 257/718; 257/720
(58) Field of Search ..................... 361/688–690, 361/698–700, 704, 709, 720, 721, 760, 767; 257/714, 715; 174/15.1, 15.2; 165/80.2, 80.3, 80.4, 104.33, 185; 428/616

(56) References Cited

U.S. PATENT DOCUMENTS

| | | | |
|---|---|---|---|
| 4,118,756 | * 10/1978 | Nelson et al. | 361/700 |
| 4,475,145 | * 10/1984 | Heil et al. | 361/720 |
| 4,931,905 | * 6/1990 | Cirrito et al. | 361/700 |
| 5,179,500 | * 1/1993 | Koubek et al. | 361/700 |
| 5,184,283 | * 2/1993 | Hamel | 361/736 |
| 5,258,887 | * 11/1993 | Fortune | 361/720 |
| 5,343,359 | * 8/1994 | Morton et al. | 361/707 |
| 5,404,272 | * 4/1995 | Lebailly et al. | 361/700 |
| 5,469,329 | * 11/1995 | Reddy et al. | 361/704 |
| 5,506,032 | * 4/1996 | Rowe | 428/178 |
| 5,682,943 | * 11/1997 | Yao et al. | 165/104.21 |
| 5,912,803 | * 6/1999 | Dahl et al. | 361/704 |
| 5,946,190 | * 8/1999 | Patel et al. | 361/700 |
| 5,986,887 | * 11/1999 | Smith et al. | 361/704 |
| 6,075,701 | * 6/2000 | Ali et al. | 361/704 |

* cited by examiner

Primary Examiner—Leo P. Picard
Assistant Examiner—Boris L. Chervinsky
(74) Attorney, Agent, or Firm—Locke Liddell & Sapp LLP

(57) ABSTRACT

A cooling system for a circuit board employs a heat-conducting channel within the board. The channel is thermally coupled to an electrical device mounted on the board, and leads to an edge of the board. The edge of the board is coupled to a heat-dissipating can. The use of channels leading to the edges of the board allows a single can to dissipate heat for a plurality of boards and a plurality of devices.

8 Claims, 1 Drawing Sheet

ELECTRICAL CIRCUIT BOARD HEAT DISSIPATION SYSTEM

BACKGROUND OF THE INVENTION

1. Field of the Invention

The present invention relates to a cooling system for use in connection with an electrical circuit board. More specifically, the invention involves a method and apparatus for cooling an electrical device attached to a printed circuit board by providing a thermal conduit from the device to a heat sink. The electrical circuit board cooling system has particular utility in connection with multi-layer board configurations where the heat generated by a device must be conducted to a heat sink located to the side of a printed circuit board.

2. Description of Related Information

It is common to use a beat dissipation device, such as a heat sink, for thermal cooling purposes in a circuit assembly. Traditionally, heat sinks are placed in direct contact with a device to prevent device overheating. A device is attached to a heat sink using a multiplicity of fasteners. The fasteners lengthen assembly time. Additionally, using one heat sink for each device adds to the space required by the board layout.

The problems of individual component heat sinks have been overcome by placing the entire board on a cooling surface such as a thermal pad. The thermal pad, or cold plate, acts as a heat sink, and individual components are on top of the board and heat dissipation paths go through the board to the pad, which is on the underside of the board. Multiple devices can share a single thermal pad, and connecting the devices to the thermal pad conserves space and assembly time.

The design space for electrical components is shrinking. As goods become smaller, more components are squeezed into a decreasing amount of space. The space required by thermal pads becomes relevant and, particularly as boards are mounted close to other boards, the thermal pad of one board may generate heat that affects other components. Although the boards may be oriented differently, so that a component "sandwich" is formed, this formation makes multiple thermal pads a necessity.

To meet space requirements and overcome other drawbacks of multiple heat sinks or pads, a need exists for a simple and inexpensive method and apparatus that can minimize thermal dissipation device space requirements in a design where circuit boards are stacked or otherwise placed in close proximity to one another.

SUMMARY OF THE INVENTION

The present invention overcomes the above-mentioned disadvantages and drawbacks which are characteristic of the related information. The present invention provides heat dissipation for a circuit board by employing a heat-conducting channel within the board and a heat-dissipating can. The channel is thermally coupled to an electrical device mounted on the board, and leads to an edge of the board. The edge of the board is thermally coupled to the heat-dissipating can. The use of channels leading to the edges of the board allows a single can to dissipate heat for a plurality of boards and a plurality of devices, thereby decreasing the space required by the system.

Numerous objects, features and advantages of the present invention will be readily apparent to those of ordinary skill in the art upon a reading of the following detailed description of presently preferred, but nonetheless illustrative, embodiments of the present invention when taken in conjunction with the accompanying drawing.

DESCRIPTION OF THE PREFERRED EMBODIMENTS

Figure 1:
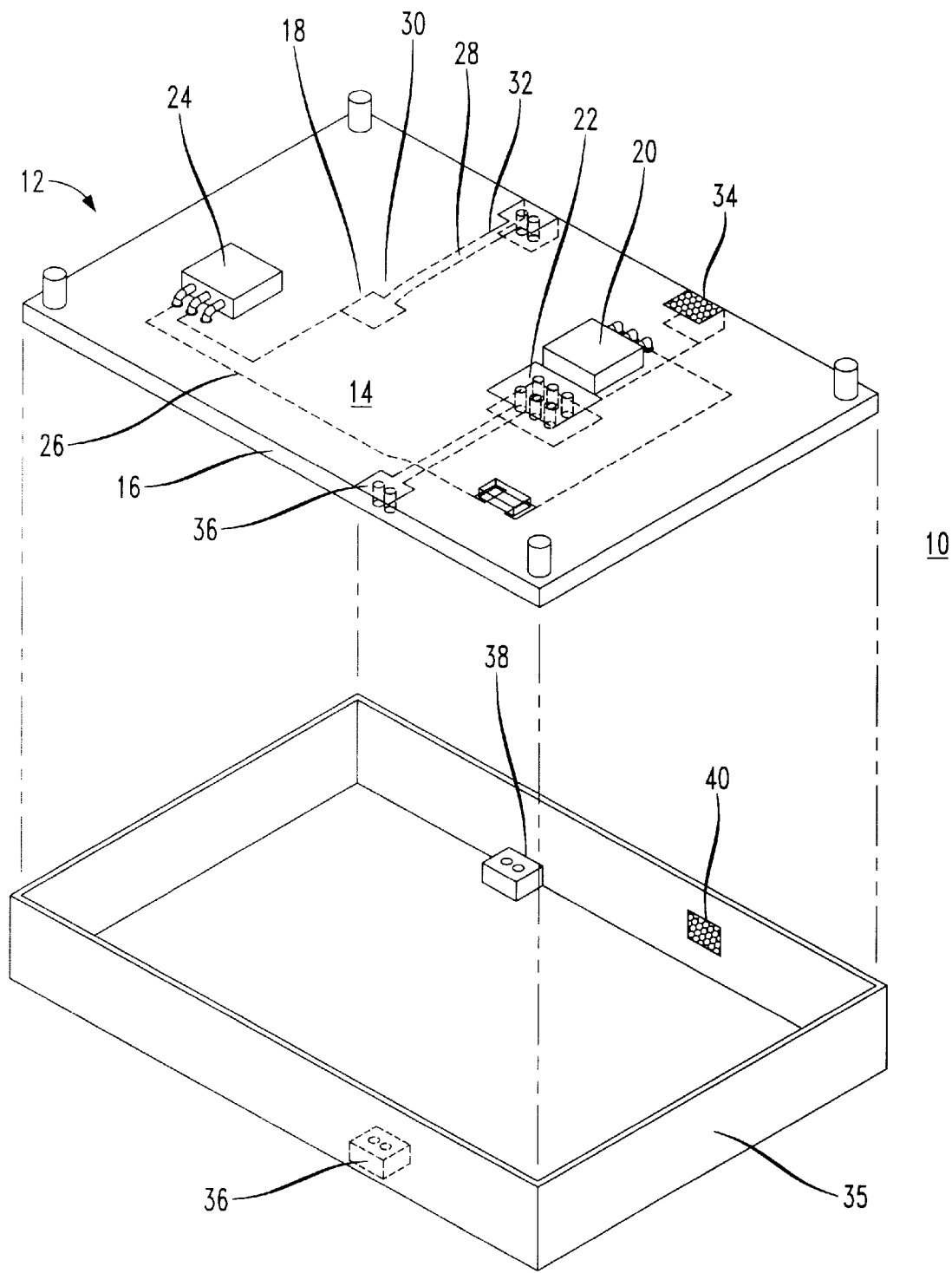
FIG. 1 is a perspective view of the system.

Referring now to the drawing, a preferred embodiment of the heat-dissipation system of the present invention is shown and generally designated by the reference numeral 10. A circuit board 12 having a top surface 14, a bottom surface and a plurality of edges 16 is displayed. In the present embodiment, the circuit board 12 is a standard printed circuit board. The circuit board 12 has several mounting pads 18 for electrical devices on a top surface 14 of the board 12. A mounting pad may be a surface mount pad 18 for soldering surface mount devices 20 thereon, or the mounting pad may include through holes 22 for the reception of a through hole device 24. In the present embodiment, only the top surface 14 is employed for devices, but those trained in the art will readily recognize that both the top and bottom surfaces may be used for a dual-sided board.

The printed circuit board 12 has circuit paths 26 and heat-conducting channels 28, or ducts, embedded within the board. Circuit paths 26 are well known in the art. The heat-conducting channels 28 are thermally coupled to the device mounting pads 18, at an initial end 30 and are thermally coupled to an edge 16 of the circuit board 12 at an opposite terminal end 32. An advantage to the invention is that a single board 12 may have multiple heat-conducting channels 28 for a plurality of devices 20, 24. This allows several components to share a single heat dissipation device. In addition, multiple mounting pads 18 can thermally connect with one channel 28 allowing one channel to provide heat dissipation for multiple devices. The channels 28 may be formed by copper in the same manner as circuit paths. In multi-layer board construction they can be formed during manufacture of the board. Alternatively, the channels 28 may be drilled or otherwise tunneled from the edge 16 of the board 12 after the board 12 is formed. In either event, channels 28 can be filled with solder or another heat-conducting metal or material such as solder. Heat pipes known in the art can also be employed. When copper is used the result is that a traditional copper plated via, instead of carrying electrical current, is used to conduct heat to the side of the board and the side wall of a heat dissipating can.

The terminal end 32 of the heat-conducting channel 28 is adjacent to an edge 16 of a circuit board 12. In the present embodiment, the edge 16 of the board 12 at the terminal end 32 of the channel 28 can be plated with a metal material, such as solder. The plate may form a solder pad 34 or may comprise tapable holes 36 for a mechanical connector known in the art, such as a threaded fastener. The initial end 30 of the channels 28 may also be thermally coupled to the mounting pads 18 in a similar fashion, and comprise a solder plate in the present embodiment.

A heat-dissipating can 35 is also shown in FIG. 1. In the present embodiment, the can 35 comprises a metal cooling jacket that surrounds the perimeter of the circuit board 12 at its edges 16. An advantage of the invention is that several circuit boards 12 may be stacked in a single can 35. The can 35 may comprise mounting feet with tapable holes 38 for reception of and thermal coupling to terminal end 32 of a channel 28 via a mechanical connector fastening tapable holes on the edge plate 34 of the board 12 to the can 35. In the alternative, the board 12 may be attached and thermally coupled via solder connecting a solder pad type edge plate 34 at the circuit board edge 16 to a solderable surface 40 on the can 35.

While a preferred embodiment of the electrical circuit board heat dissipation system has been described in detail, it should be apparent that modifications and variations thereto are possible, all of which fall within the true spirit and scope of the invention. For example, mounting pads other than surface mount pads or through holes may be employed. Also, the heat-dissipating channels may be filled with any suitable material, and any suitable material may be used to form the can. Additionally, methods other than soldering or mechanical fasteners may be used to secure and thermally couple the board to the can.

What is claimed is:

1. A cooling system for a printed circuit board adapted for mounting electrical devices, the system comprising;

a printed circuit board having a top surface, a bottom surface, and a plurality of edges;

said top surface including circuit paths and a mounting pad for mounting an electrical device;

a heat conductive path disposed between said top surface and said bottom surface of said printed circuit board, said heat conductive path having first and second ends, said first end being thermally coupled to said mounting pad, and said second end extending to one of said printed circuit board edges; and means for dissipating heat, said heat dissipating means being thermally coupled to said second end of said heat conductive path and disposed adjacent to said one of said printed circuit board edges.

2. The system of claim 1 wherein said means for dissipating heat includes a heat dissipating can.

3. The system of claim 1 wherein said means for dissipating heat includes a metal cooling jacket.

4. The system of claim 1 wherein said heat conductive path includes copper material.

5. The system of claim 1 wherein said second end of said heat conductive path is solder plated for attaching said means for dissipating heat to said heat conductive path.

6. A cooling system for a printed circuit board adapted for mounting electrical devices, the system comprising;

a printed circuit board having a top surface, a bottom surface, and a plurality of edges;

said top surface including circuit paths and a mounting pad for mounting an electrical device;

a copper trace disposed between said top surface and said bottom surface of said printed circuit board, said copper trace having first and second ends, said first end being thermally coupled to said mounting pad, and said second end being solder plated and extending to one of said printed circuit board edges; and a heat sink thermally coupled to said second end of said heat conductive path and disposed adjacent to said one of said printed circuit board edges.

7. The system of claim 6 wherein said heat sink includes a heat dissipating can.

8. The system of claim 6 wherein said heat sink includes a metal cooling jacket.

* * * * *